(12) United States Patent
Yoshida et al.

(10) Patent No.: US 6,953,732 B2
(45) Date of Patent: Oct. 11, 2005

(54) METHOD OF MANUFACTURING A SEMICONDUCTOR DEVICE INCLUDING A MOSFET WITH NITRIDE SIDEWALLS

(75) Inventors: Masahiro Yoshida, Tokyo (JP); Shunichi Tokitoh, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/762,361

(22) Filed: Jan. 23, 2004

(65) Prior Publication Data

US 2004/0152275 A1 Aug. 5, 2004

Related U.S. Application Data

(62) Division of application No. 10/320,660, filed on Dec. 17, 2002, now Pat. No. 6,700,167, which is a division of application No. 09/759,639, filed on Jan. 16, 2001, now Pat. No. 6,528,854.

(30) Foreign Application Priority Data

Jan. 17, 2000 (JP) .......................................... 2000-010250

(51) Int. Cl.[7] ..................... H01L 21/336; H01L 21/8238
(52) U.S. Cl. ......................... 438/305; 438/232; 438/301
(58) Field of Search ................................ 438/585, 595, 438/305, 286, 301, 232

(56) References Cited

U.S. PATENT DOCUMENTS

| 4,480,375 | A | * | 11/1984 | Cottrell et al. ............... 438/232 |
| 4,810,666 | A | | 3/1989 | Taji |
| 5,314,834 | A | * | 5/1994 | Mazure et al. ............... 438/301 |
| 5,620,914 | A | | 4/1997 | Hikida et al. |
| 5,817,562 | A | * | 10/1998 | Chang et al. ................ 438/305 |
| 5,851,890 | A | | 12/1998 | Tsai et al. |
| 5,972,757 | A | | 10/1999 | Ema |
| 6,017,823 | A | | 1/2000 | Shishiguchi et al. |
| 6,080,648 | A | | 6/2000 | Nagashima |
| 6,080,682 | A | * | 6/2000 | Ibok ........................... 438/770 |
| 6,093,945 | A | * | 7/2000 | Yang ............................ 257/317 |
| 6,165,880 | A | * | 12/2000 | Yaung et al. ................ 438/592 |
| 6,254,676 | B1 | * | 7/2001 | Yang et al. ................. 438/286 |

(Continued)

FOREIGN PATENT DOCUMENTS

| JP | 61-16571 | 1/1986 |
| JP | 05-198794 | 8/1993 |
| JP | 07-321309 | 12/1995 |
| JP | 09-008307 | 1/1997 |
| JP | 09-045908 | 2/1997 |
| JP | 09-129872 | 5/1997 |

OTHER PUBLICATIONS

Focused Technology Report: Report Number: FTR 9912–008; Comparative Analysis of Advanced Sub–Micron Transistor Technology ; By Integrated Circuit Engineering Corporation; 1999.

*Primary Examiner*—Michael S. Lebentritt
*Assistant Examiner*—Walter L. Lindsay, Jr.
(74) *Attorney, Agent, or Firm*—Volentine Francos & Whitt, PLLC

(57) ABSTRACT

A method of manufacturing a semiconductor device includes providing a semiconductor substrate, and then forming a gate insulating layer on the semiconductor substrate. A lower gate electrode layer and a cap gate layer are formed on the gate insulating layer. The lower gate electrode layer and the cap gate layer are patterned to form a gate electrode structure. An LDD region is formed on the semiconductor substrate. An oxide layer is formed on the gate electrode structure and the semiconductor substrate. A thickness of the oxide layer is greater than a thickness of the gate insulating layer. Next, a nitride layer is formed on the oxide layer. Finally, the oxide layer and the nitride layer are etched to form a nitride sidewall spacer on the gate electrode structure through the oxide layer.

20 Claims, 23 Drawing Sheets

U.S. PATENT DOCUMENTS

| | | |
|---|---|---|
| 6,287,924 B1 | 9/2001 | Chao et al. |
| 6,294,481 B1 | 9/2001 | Inumiya et al. |
| 6,329,248 B1 * | 12/2001 | Yang .......................... 438/267 |
| 6,392,310 B1 * | 5/2002 | Matsunaga .................. 257/296 |
| 6,528,854 B1 | 3/2003 | Yoshida et al. |
| 6,770,417 B2 * | 8/2004 | Nozaki et al. ........... 430/270.1 |
| 6,770,550 B2 * | 8/2004 | Kunikiyo .................... 438/585 |
| 6,777,761 B2 * | 8/2004 | Clevenger et al. .......... 257/388 |

* cited by examiner

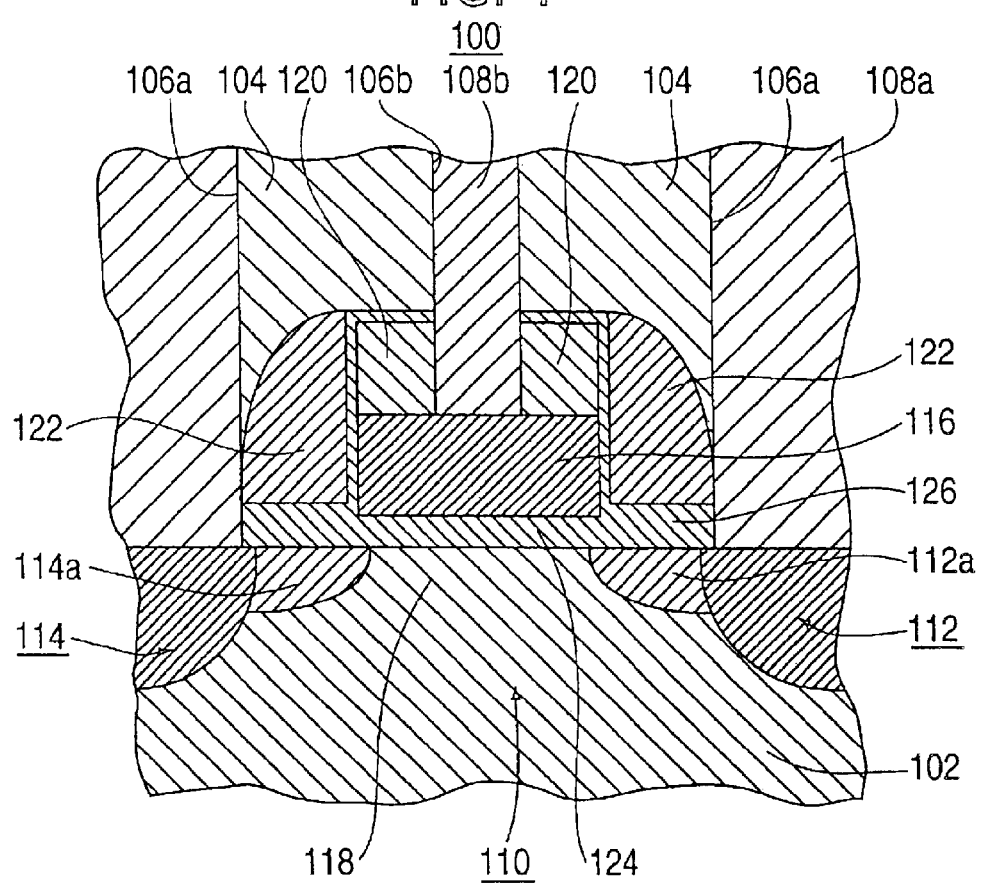

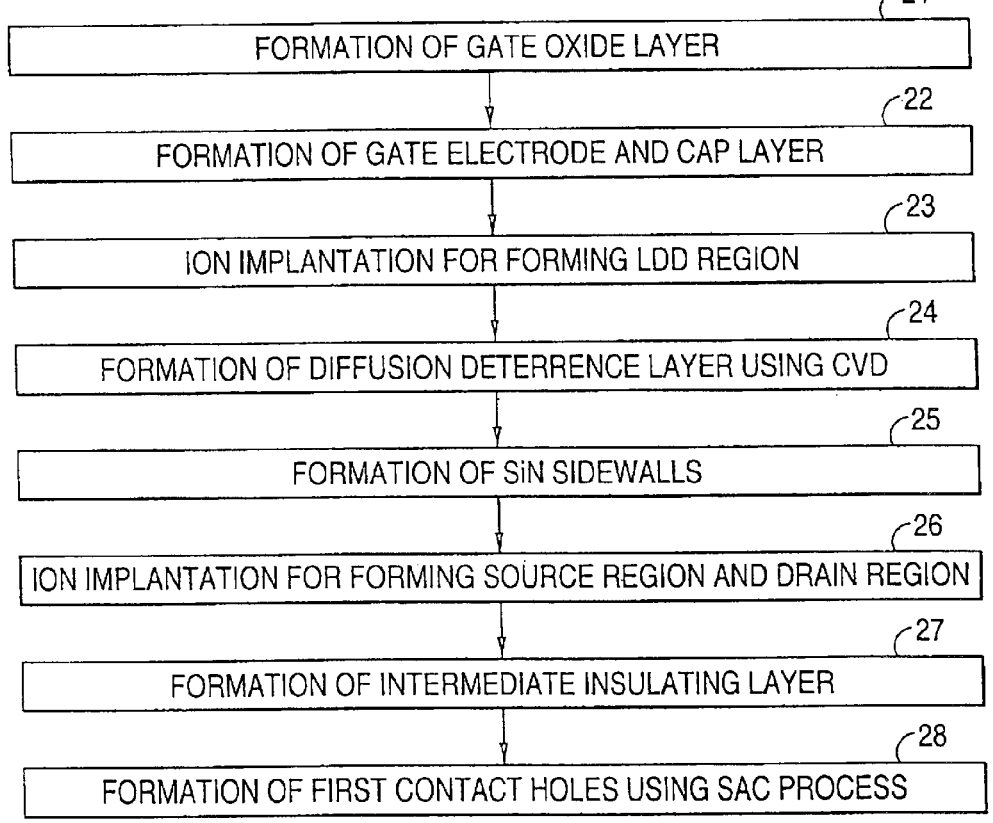

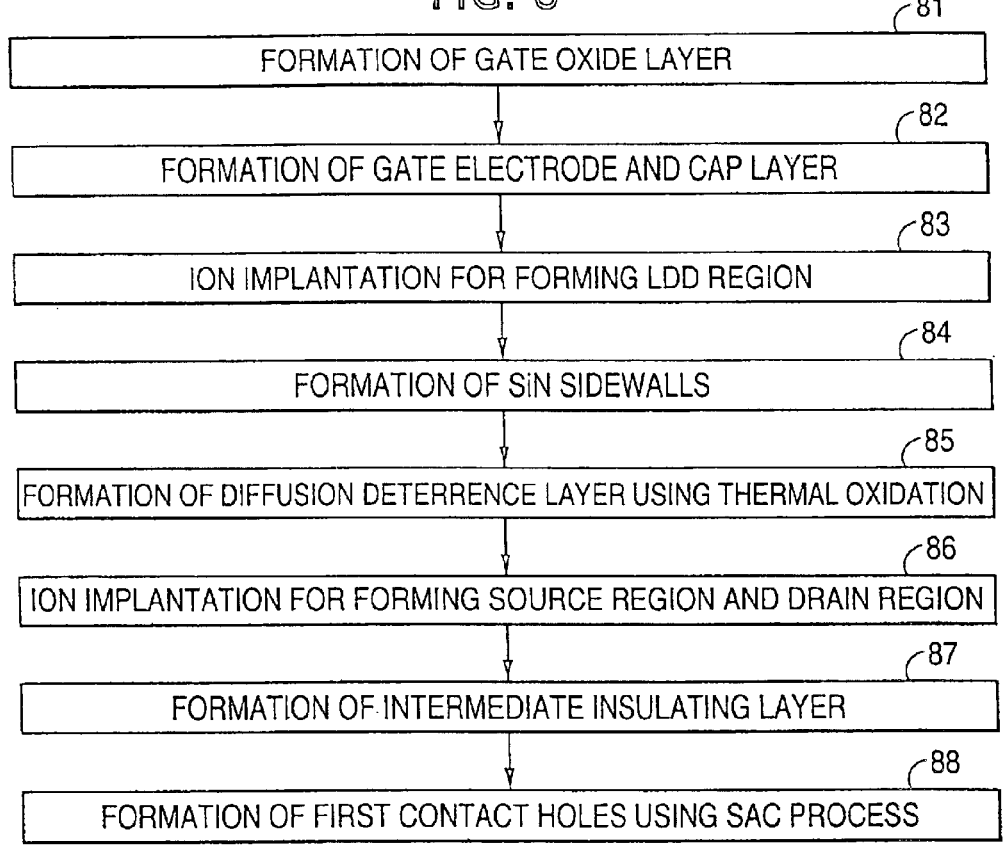

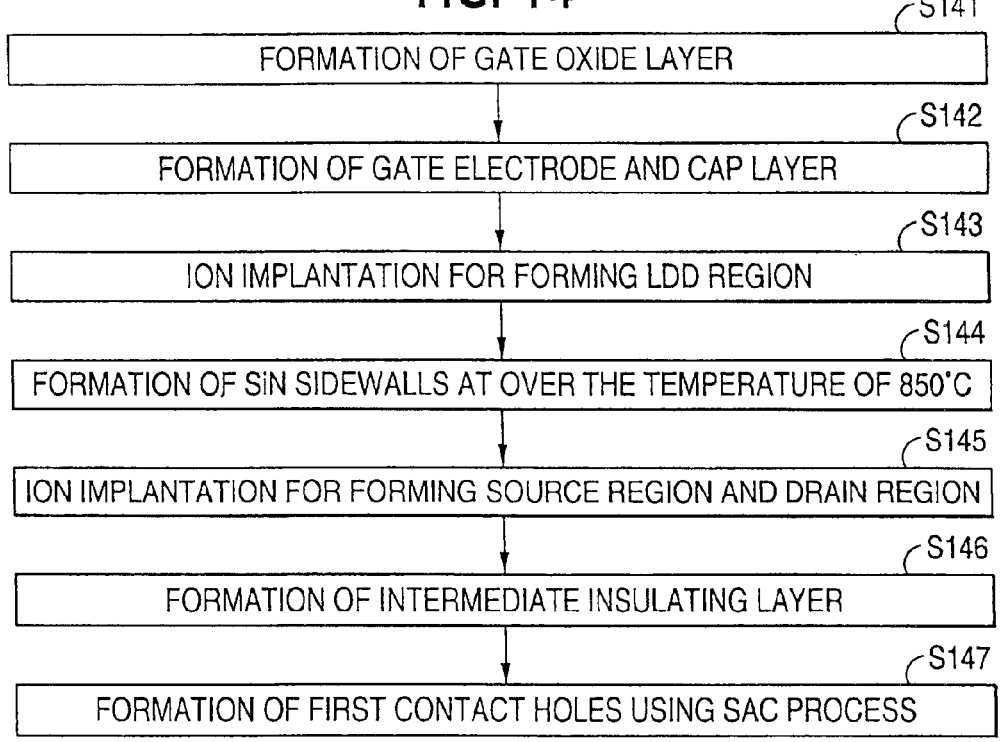

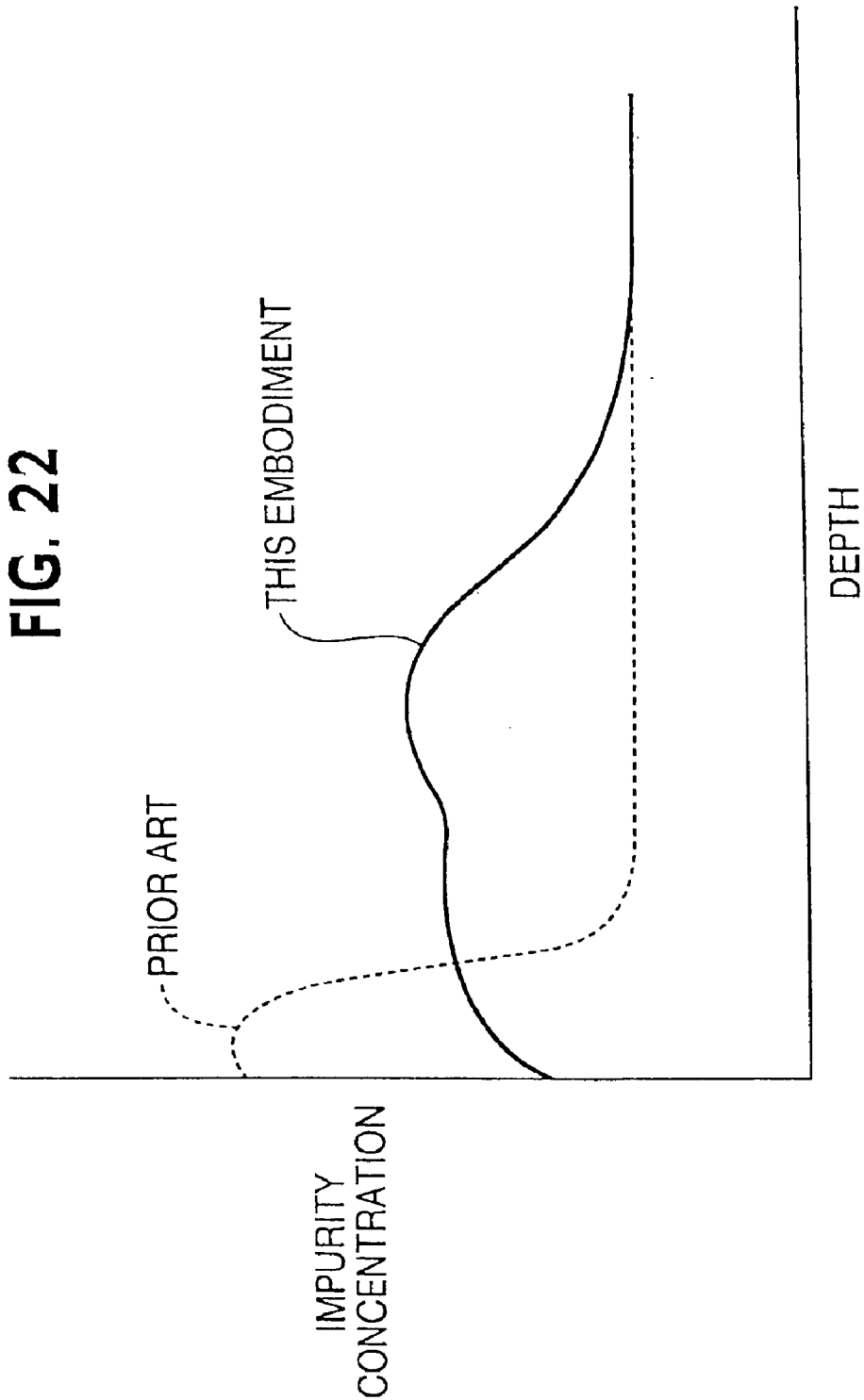

METHOD OF MANUFACTURING A SEMICONDUCTOR DEVICE INCLUDING A MOSFET WITH NITRIDE SIDEWALLS

CROSS REFERENCE TO RELATED APPLICATIONS

This is a divisional application of application Ser. No. 10/320,660, filed Dec. 17, 2000 now U.S. Pat. No. 6,700,167, which is a divisional application of Ser. No. 09/759,639 filed Jan. 16, 2001, now U.S. Pat. No. 6,528,854, which are hereby incorporated by reference in their entirety for all purposes.

BACKGROUND OF THE INVENTION

1. Field of the Invention

This invention relates to a semiconductor device and to a method for manufacturing the same. In particular, the present invention relates to a MOSFET which has side wall structure and to a method for manufacturing the same.

This is a counterpart of, and claims priority to, Japanese Patent Application No. 2000-010250, filed on Jan. 17, 2000, the contents of which are incorporated herein by reference.

2. Description of the Related Art

A Self-Aligned Contact (SAC) method is an important technique used in fabricating semiconductor devices. This technology is described in the article entitled "A Process Technology for 1 Giga-Bit DRAM" IEDM Tech. Dig., pp907–910, 1995.

SiN is generally used as sidewalls of a gate electrode in the SAC process. This is because the etching rate of SiN is different from that of silicon-oxide, and therefore SiN sidewalls are used as a stopper in etching on an intermediate oxide layer.

FIG. 23 is a schematic diagram of a MOSFET 800 manufactured using an SAC process.

A gate oxide layer 824 having a constant thickness is formed on a silicon substrate 802. A gate electrode 816 is formed on the gate oxide layer 824. A SiN cap layer 820 is formed on the gate electrode 816. SiN sidewalls 822, which cover the side surfaces of the gate electrode 816, are formed on the gate oxide layer 824.

A heat treatment is generally performed in manufacturing of the MOSFET 800 after the formation of sidewalls. In case of SiN sidewalls, hydrogen and nitrogen may be diffused into the silicon substrate 802 through the gate oxide layer 824 during the heat treatment. Therefore, MOSFETs which have SiN sidewalls are less reliable due to resultant hot-carrier degradation than MOSFETs which have sidewalls of silicon oxide. These problems are pointed out and discussed in the article entitled "Enhancement of Hot-Carrier Induced Degradation under Low Gate Voltage Stress due to Hydrogen for NMOSFETs with SiN films" S.Tokitoh et al. IRPS, pp307–311, 1997 and "Hot-carrier Degradation Mechanism and Promising Device Design of nMOSFETs with Niteride Sidewall Spacer" Y.Yamasugi et al. IRPS, pp 184–188, 1998.

SUMMARY OF THE INVENTION

An object of the present invention is to provide a method of manufacturing a reliable semiconductor device.

According to the aspect of the present invention, a semiconductor substrate is prepared. Next, a gate insulating layer is formed on the semiconductor substrate. A lower gate electrode layer and a cap gate layer are formed on the gate insulating layer. The lower gate electrode layer and the cap gate layer are patterned to form a gate electrode structure. An LDD region is formed on the semiconductor substrate. An oxide layer is formed on the gate electrode structure and the semiconductor substrate. A thickness of the oxide layer is greater than a thickness of the gate insulating layer. Next, a nitride layer is formed on the oxide layer. Finally, the oxide layer and the nitride layer are etched to form a nitride sidewall spacer on the gate electrode structure through the oxide layer.

BRIEF DESCRIPTION OF THE DRAWINGS

While the specification concludes with claims particularly pointing out and distinctly claiming the subject matter that is regarded as the invention, the invention, along with the objects, features, and advantages thereof, will be better understood from the following description taken in conjunction with the attached drawings, in which:

FIG. 1 is a cross sectional view showing a semiconductor device according to a first preferred embodiment.

FIG. 2 is a flow chart of a method for manufacturing the semiconductor device of first embodiment.

FIG. 8 is a flow chart of a method for manufacturing the semiconductor device of the third embodiment.

FIG. 14 is a flow chart of a method for manufacturing the semiconductor device of the fifth embodiment.

FIG. 22 shows the impurity concentration of the LDD regions of the seventh embodiment

DETAILED DESCRIPTION OF THE PREFERRED EMBODIMENTS

Figure 3A:
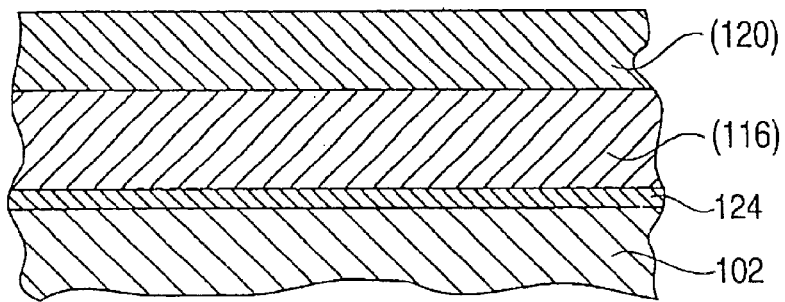
FIG. 3 is a cross sectional view showing the method for manufacturing the semiconductor device of the first embodiment.
Figure 3B:
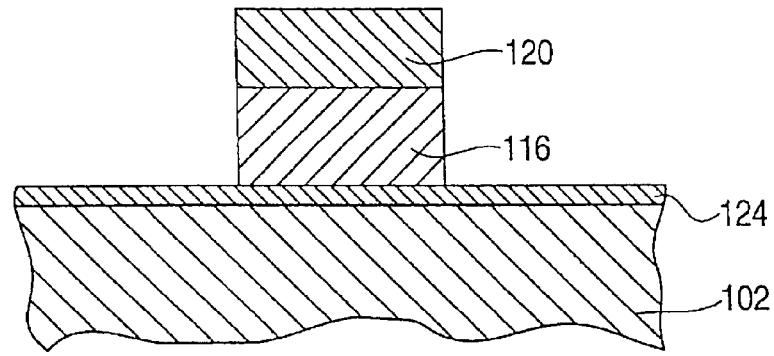
Figure 3C:
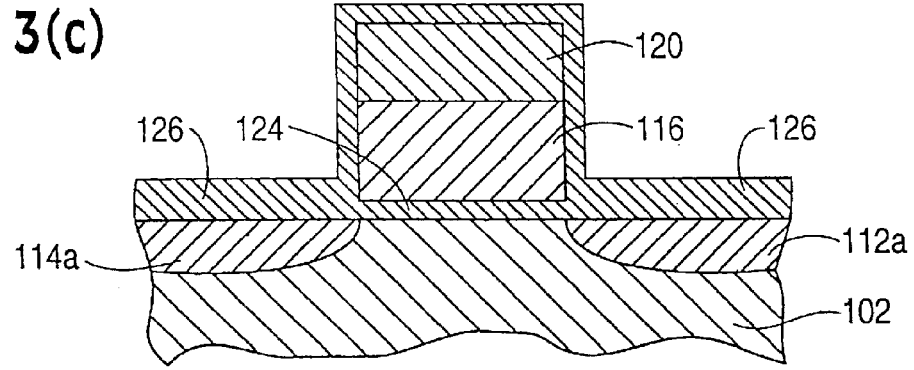
Figure 3D:
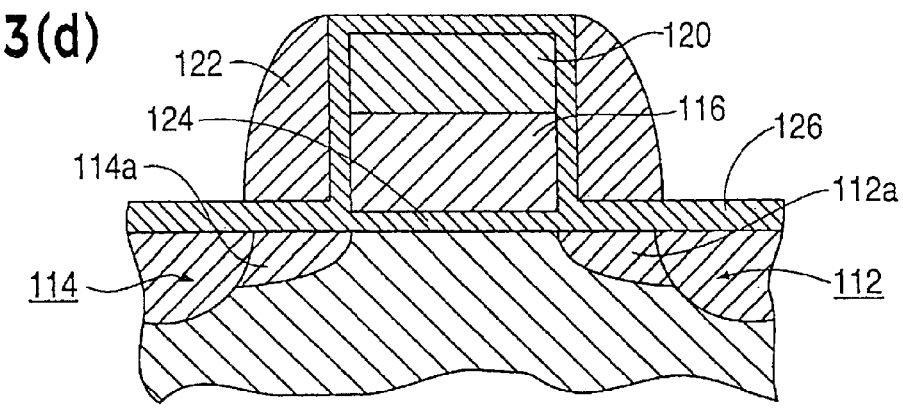

FIG. 1 is a cross sectional view showing a semiconductor device according to a first preferred embodiment of this invention.

The semiconductor device 100 of this embodiment has a silicon substrate 102, an intermediate insulating layer 104, and a MOSFET 110. The MOSFET 110 is formed on the silicon substrate 102. The intermediate insulating layer 104 is formed on the silicon substrate 102 and MOSFET 110. The intermediate insulating layer 104 is made of silicon oxide.

MOSFET 110 has a source region 112, a drain region 114, a gate electrode 116, and a channel region 118. The MOSFET 110 of this embodiment has a LDD structure as shown by 112*a*, 114*a*. The source region 112, the drain region 114 and the channel region 118 are formed in the semiconductor substrate 102. The gate electrode 116 is formed over the semiconductor substrate 102. The channel region 118 is formed between the source region 112 and the drain region 114, and under the gate electrode 116. For example, the N channel MOSFET (110) includes a P type substrate (102) into which two heavily doped N regions (112,114) and two lightly doped regions (112*a*,114*a*) have been diffused.

MOSFET 110 has a cap layer 120 and sidewall structure 122. The cap layer 120 is formed on the gate electrode 116. Sidewall structure 122 are formed over the silicon substrate 102. The sidewalls 122 cover both sides of the gate electrode 116. A material which is different from the intermediate insulating layer 104 is used as the cap layer 120 and sidewalls 122. The cap layer 120 and sidewalls 122 are made of SiN in this embodiment.

The MOSFET 110 has a gate oxide layer 124 and diffusion deterrent layers 126. The gate oxide layer 124 and a diffusion deterrent layer 126 are formed on the surface of the silicon substrate 102. The gate oxide layer 124 is formed under the gate electrode 116. The diffusion deterrent layers 126 are formed under the sidewalls 122. These diffusion deterrent layers 126 prevent hydrogen and nitrogen in the sidewalls 122 from diffusing into the silicon substrate 102. The gate oxide layer 124 has a thickness of about 10 nm (100 Å). The diffusion deterrent layers 126 are preferably twice the thickness against of the gate oxide layer 124. The gate oxide layer 124 and the diffusion deterrent layers 126 are made of silicon oxide. Since the thicknesses of the diffusion deterrent layers 126 are greater than the gate oxide layer 124, hydrogen and nitrogen in the sidewalls do not diffuse into the silicon substrate 102.

The semiconductor device also has first contact holes 106*a*, first interconnections 108*a*, a second contact hole 106*b*, and a second interconnection 108*b*.

The first contact holes 106*a* are formed using a SAC process. SiN sidewalls 122 are used as a stopper in etching on the intermediate oxide layer 104. The first interconnections 108*a* are respectively connected to the drain region 114 and the source region 112. The second interconnection 108*b* is connected to the gate electrode 116.

For example, in a semiconductor memory-cell, the source region 112 is connected to a bit line, and the drain region 114 is connected to a storage capacitor, through first interconnections 108*a*. The gate electrode 116 is connected to a word line through the second interconnection 108*b*.

The MOSFET 110 of this embodiment has a silicon oxide layer 126 under the sidewalls, and this silicon oxide layer 126 is thicker than the silicon oxide layer 124 under the gate electrode 116. The silicon oxide layer 126 has a thickness to prevent the diffusion of hydrogen and nitrogen. Therefore, the silicon oxide layer 126 works as diffusion deterrent layer. The thickness of the diffusion deterrent layer 126 depends on the width of sidewalls 122. There is an effect if the thickness of the silicon oxide layer 126 is 50% greater than the thickness of the silicon oxide layer 124. However, it is desirable that the diffusion deterrent layer 126 be at least twice the thickness of the gate oxide layer 124.

FIG. 2 is a flow chart of a method for manufacturing the semiconductor device of this embodiment, and FIG. 3 is a cross sectional view showing the method for manufacturing the same. The method for manufacturing the semiconductor device of this embodiment is described below.

The gate oxide layer 124 is formed on the surface of the semiconductor substrate 102 using a thermal oxidation. (Step 21) This gate oxide layer 124 has a thickness of about 10 nm.

The gate electrode material 116 and the cap layer material 120 are formed on the gate oxide layer 124 as seen in FIG. 3(*a*). A lithography method and an anisotropic etching technique, such as a RIE method, are employed to etch the gate electrode material 116 and the cap layer material 120. The gate electrode 116 and the cap layer are formed as seen in FIG. 3(*b*). (Step 22)

Ion implantation for forming the LDD region 112*a* and 114*a* is performed by using the cap layer 120 as the mask. This implantation makes lightly doped regions 112*a* and 114*a*. (Step 23)

A silicon oxide layer 126 is formed on the gate oxide layer 124 using CVD. As the gate electrode 116 and the cap layer 120 are used as a mask, this silicon oxide layer 126 is deposited on the gate oxide layer 124 other than the portion under the gate electrode 116 (as shown in FIG. 3(*c*)). Therefore, a thickness of the gate oxide layer other than the portion under the gate electrode layer is increased. This silicon oxide layer 126 works as the diffusion deterrent layer 126. (Step 24) The oxide layer 126 is deposited at about 10 nm on the gate oxide layer beside the gate electrode 126, therefore the diffusion deterrent layer 126 has a thickness of about 20 nm.

An SiN sidewall layer, having a thickness of from 100 nm to 200 nm, is formed over the semiconductor substrate using LP-CVD. An anisotropic etching technique, such as a RIE method, is employed to etch the SiN sidewall layer, so that SiN sidewalls are formed. (Step 25)

An ion implantation for forming the source region 112 and the drain region 114 is performed by using the cap layer 120 and sidewalls 122 as a mask. An annealing is performed after the ion implantation. This annealing diffuses implanted ions and forms the source region 112 and the drain region 114 as shown in FIG. 3(*d*). (Step 26)

The intermediate insulating layer 104 is formed over the semiconductor substrate 102. (Step 27) The intermediate insulating layer 104 is made of a material which is different from the material of the cap layer 120 and the side walls 122. The intermediate insulating layer 104 is made of silicon oxide in this embodiment.

The first contact holes 106a are formed using a SAC process. (Step 28) The intermediate insulating layer 104 is etched using an etchant which has a smaller etching rate for SiN than for silicon-oxide. SiN sidewalls are used as a stopper. The intermediate layer 104 and the silicon oxide 126 over the source region and drain region are etched in this step.

The interconnections 108a are formed in the contact holes 106a. The second contact hole and the second interconnection are formed after the first interconnections are formed.

In this embodiment, the diffusion deterrent layers 126 prevent hydrogen and nitrogen in the sidewalls from diffusing into the silicon substrate 102 during annealing. Therefore, interface traps, which are related to hot carrier, are reduced near the surface of the semiconductor substrate, this improving the reliability of the MOSFET 110.

The diffusion deterrent layer 126 is formed using CVD in this embodiment. Therefore, the thickness of the diffusion deterrent layer 126 is controlled precisely, and characteristics of the MOSFET are easily controlled.

Figure 4:
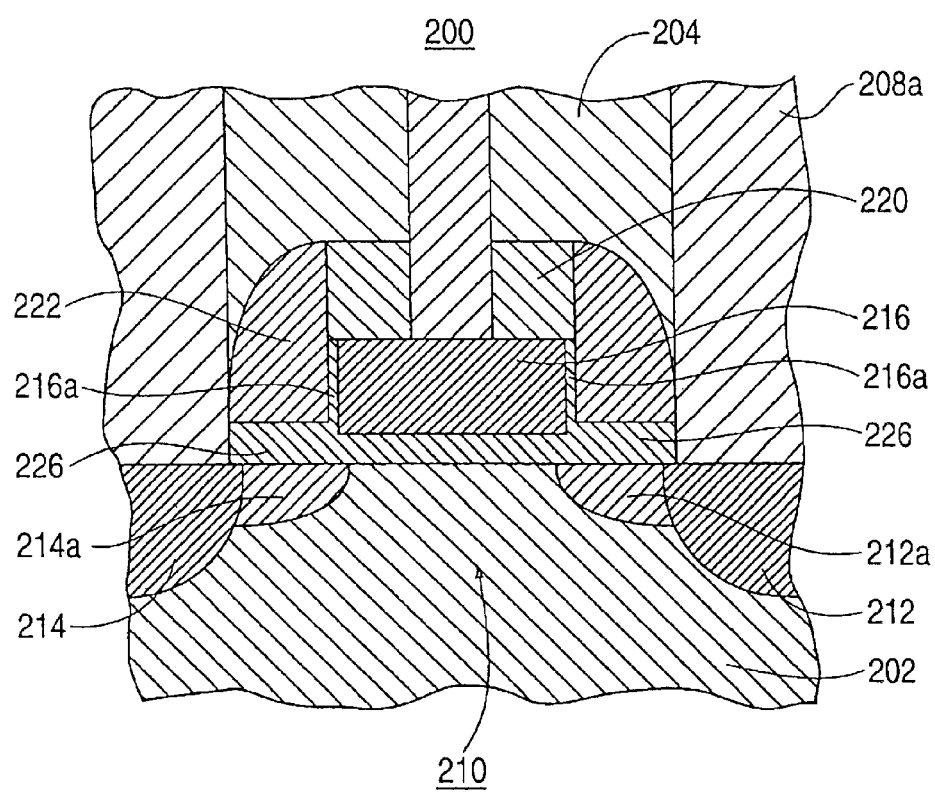
FIG. 4 is a cross sectional view showing a semiconductor device according to a second preferred embodiment.

FIG. 4 is a cross sectional view showing a semiconductor device according to a second preferred embodiment of this invention.

The semiconductor device 200 has a MOSFET 210. The MOSFET 210 has a gate electrode 216. The gate electrode 216 of this embodiment has oxide wall layers 216a on its side surfaces.

The MOSFET 210 has a diffusion deterrent layer 226 on the surface of the silicon substrate 202. The other parts of the semiconductor device of this embodiment are the same as those in the first embodiment.

Figure 5:
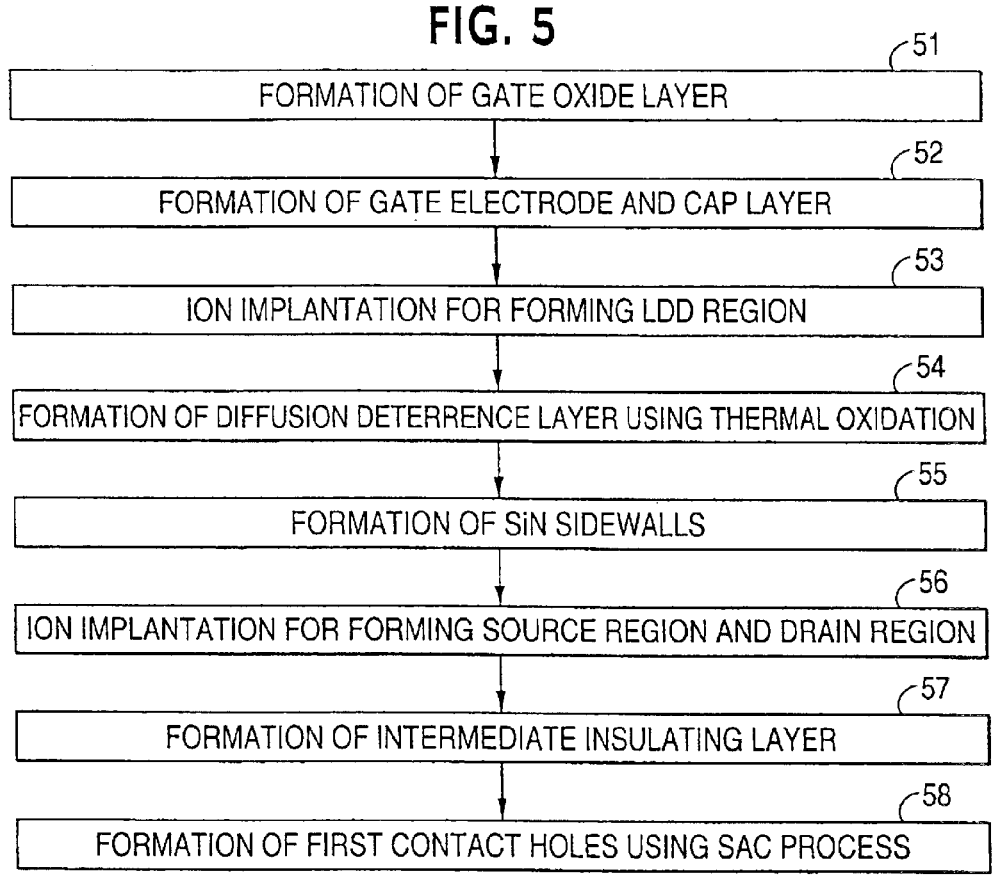
FIG. 5 is a flow chart of a method for manufacturing the semiconductor device of the second embodiment.

FIG. 5 is a flow chart of a method for manufacturing the semiconductor device of this embodiment, and FIG. 6 is a cross sectional view showing the method for manufacturing the same. The method for manufacturing the semiconductor device of this embodiment is described below.

The gate oxide layer 224 is formed on the surface of the semiconductor substrate 202 using thermal oxidation. This gate oxide layer 224 has a thickness of about 10 nm. (Step 51)

Figure 6A:
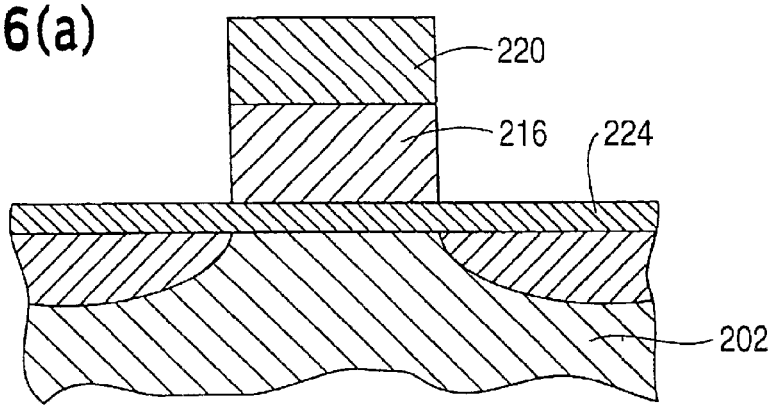
FIG. 6 is a cross sectional view showing the method for manufacturing the semiconductor device of the second embodiment.

The gate electrode material 216 and the cap layer material 220 are formed on the gate oxide layer 224. A lithography method and an anisotropic etching technique, such as a RIE method, are employed to etch the gate electrode material 216 and the cap layer material 220. The gate electrode 216 and the cap layer are formed as seen in FIG. 6(a). (Step 52)

Ion implantation for forming the LDD region 212a and 214a is performed by using the cap layer 220 as the mask. This implantation makes lightly doped regions 212a and 214a. (Step 53)

Figure 6B:
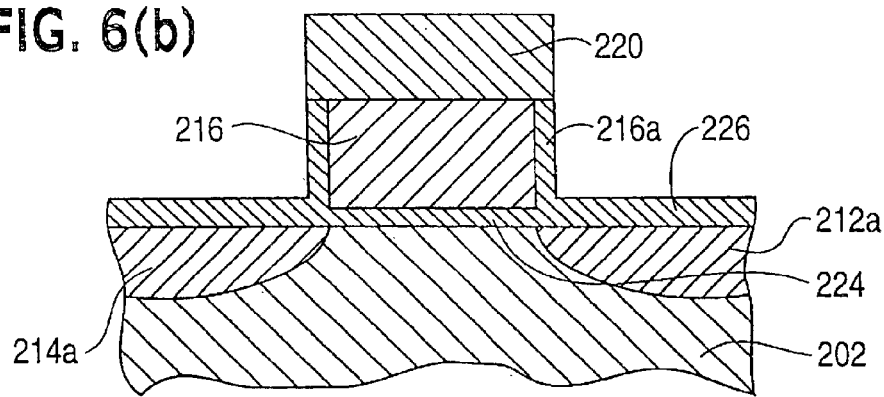

A silicon oxide layer 226 is formed on the gate oxide layer 224 using a thermal oxidation. The thermal oxidation of this embodiment is performed at a temperature of 850° C. and in an oxygen atmosphere. This thermal oxidation thickens the gate oxide layer other than at the portion thereof under the gate electrode 216. Oxide wall layers 216a of the gate electrode 216 are also formed in this thermal oxidation as seen in FIG. 6(b). This silicon oxide layer 226 works as the diffusion deterrent layer 226. The oxide layer 226 has a thickness of about 20 nm. (Step 54)

Figure 6C:
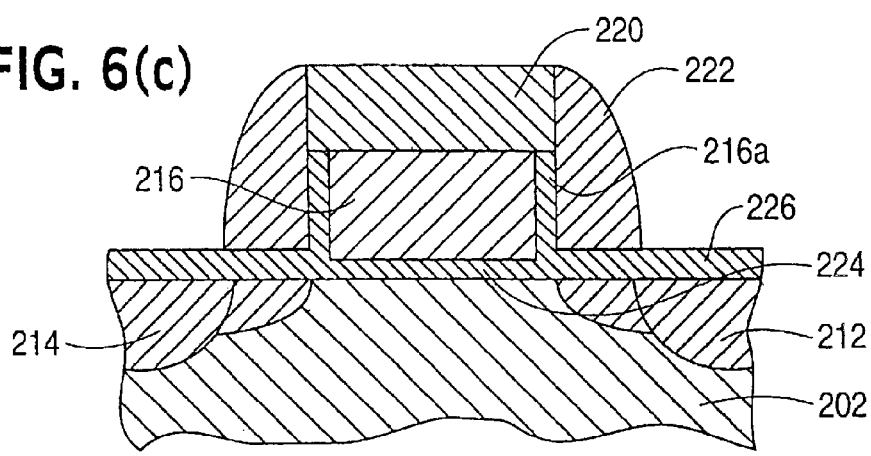

A SiN sidewall layer, having a thickness from 100 nm to 200 nm, is formed on the semiconductor substrate using LP-CVD. An anisotropic etching technique, such as a RIE method, is employed to etch the SiN sidewall layer, so that SiN sidewalls 222 are formed as seen in FIG. 6(c). (Step 55)

Subsequent steps are the same as those in the first embodiment. Steps 56–58

In this embodiment, the diffusion deterrent layer 226 prevent hydrogen and nitrogen in the sidewalls from diffusing into the silicon substrate 202 during annealing. Therefore, interface traps, which are related to hot carrier, are reduced near the surface of the semiconductor substrate, and the reliability of the MOSFET is improved.

The diffusion deterrent layer 226 is formed using thermal oxidation in this embodiment. A thin oxide layer between the sidewalls and the cap layer as shown in the first embodiment is not formed. Therefore, the alignment in the SAC process becomes more flexible.

Figure 7:
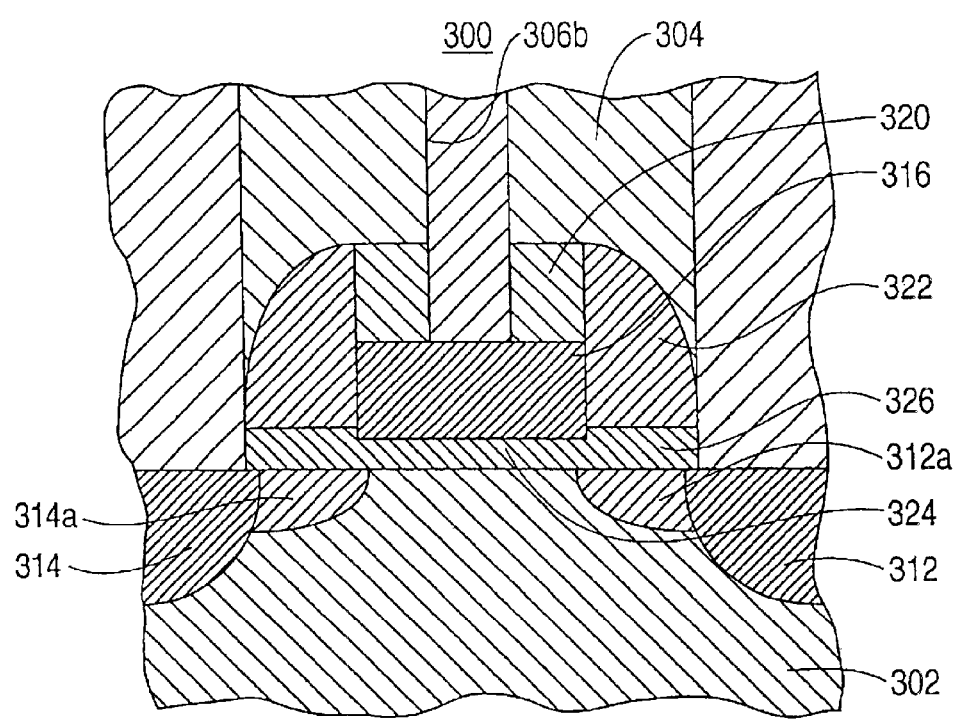
FIG. 7 is a cross sectional view showing a semiconductor device according to a third preferred embodiment.

FIG. 7 is a cross sectional view showing a semiconductor device according to a third preferred embodiment of this invention.

The semiconductor device 300 has a structure which is similar to that of the second embodiment. In third embodiment, the silicon oxide layer covering the side surfaces of the gate electrode is not formed.

FIG. 8 is a flow chart of a method for manufacturing the semiconductor device of this embodiment, and FIG. 9 is a cross sectional view showing the method for manufacturing the same. The method for manufacturing the semiconductor device of this embodiment is described below.

The gate oxide layer 324 is formed on the surface of the semiconductor substrate 302 using a thermal oxidation. This gate oxide layer 324 has a thickness of about 10 nm. (Step 81)

Figure 9A:
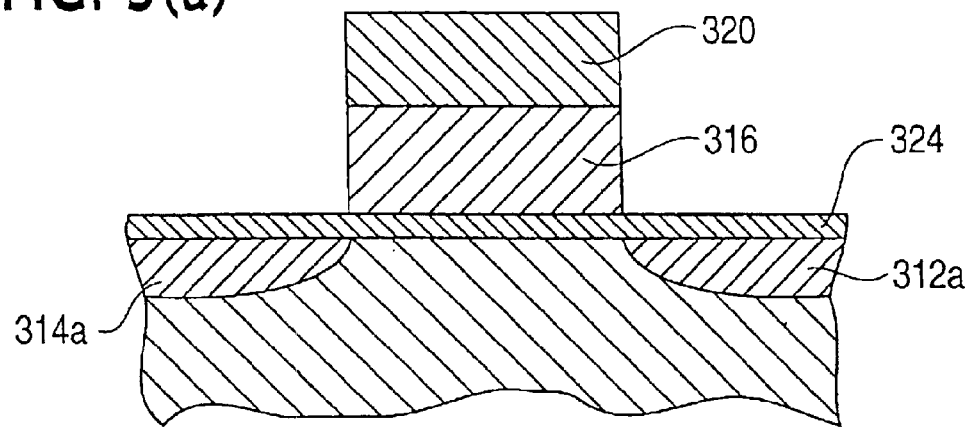
FIG. 9 is a cross sectional view showing the method for manufacturing the semiconductor device of the third embodiment.

The gate electrode material 316 and the cap layer material 320 are formed on the gate oxide layer 324. A lithography method and an anisotropic etching technique, such as a RIE method, are employed to etch the gate electrode material 316 and the cap layer material 320. The gate electrode 316 and the cap layer are formed as seen in FIG. 9(a). (Step 82)

Ion implantation for forming the LDD regions 312a and 314a is performed using the cap layer 320 as a mask. This implantation makes lightly doped regions 312a and 314a. (Step 83)

Figure 9B:
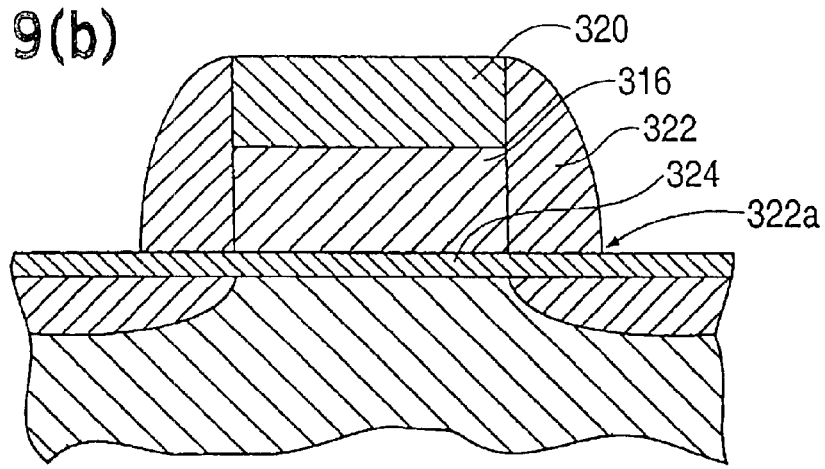

A SiN sidewall layer, having a thickness from 100 nm to 200 nm, is formed on the semiconductor substrate using LP-CVD. An anisotropic etching technique, such as a RIE method, is employed to etch the SiN sidewall layer, so that SiN sidewalls 322 are formed as seen in FIG. 9(b). (Step 84)

Figure 9C:
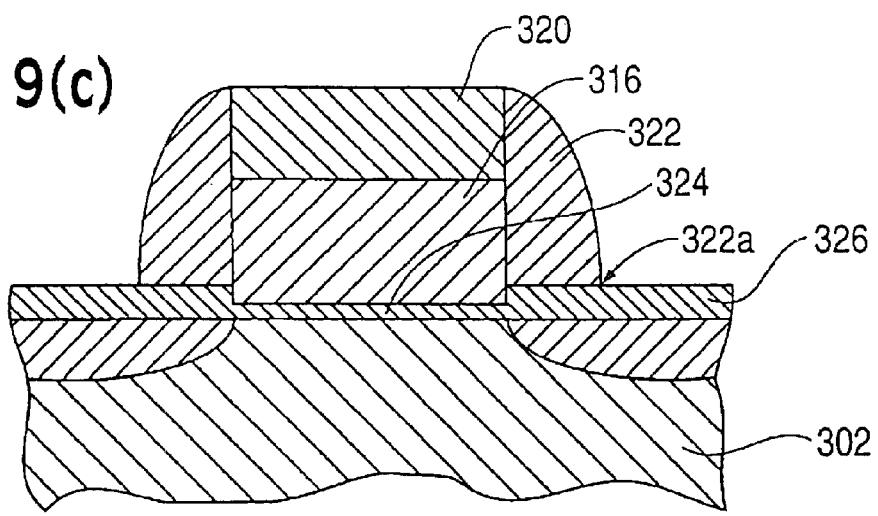

A silicon oxide layer 326 is formed on the gate oxide layer 324 using a thermal oxidation as seen in FIG. 9(c). The thermal oxidation of this embodiment is performed at a temperature of 850° C. and in an oxygen atmosphere. Thickening begins from the edge portion 322a under the side walls, and it expand into the portion near the gate electrode 326. The time of this oxidation is controlled to expand the thickness of the gate oxide layer other than at the portion lying under the gate electrode 316. This silicon oxide layer 326 works as the diffusion deterrent layer 326. The oxide layer 326 has a thickness of about 20 nm. (Step 85) Subsequent steps are the same as those in the second embodiment. (Step 86–88)

In this embodiment, the diffusion deterrent layer 326 prevents hydrogen and nitrogen in the sidewalls from diffusing into the silicon substrate 102 during annealing. Therefore, interface traps, which are related to hot carrier, are reduced near the surface of the semiconductor substrate, and the reliability of the MOSFET is improved.

The thermal oxidation is performed after the formation of sidewalls in this invention. This thermal oxidation reduces hydrogen in the oxide layer 324 under the sidewalls. Also an oxide layer on the side surface of the gate electrode is not formed in this embodiment. Therefore, a variation of the gate electrode resistance is prevented.

Figure 10:
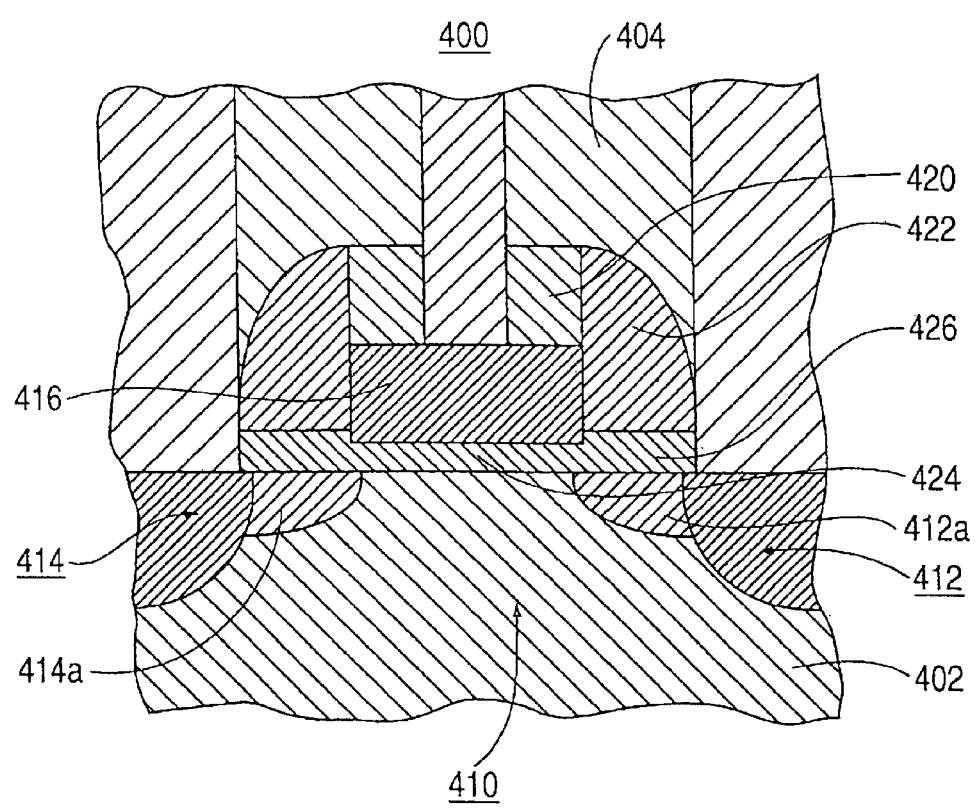
FIG. 10 is a cross sectional view showing a semiconductor device according to a fourth preferred embodiment.

FIG. 10 is a cross sectional view showing a semiconductor device according to a fourth preferred embodiment of this invention.

The semiconductor device 400 has the same structure as the third embodiment.

Figure 11:
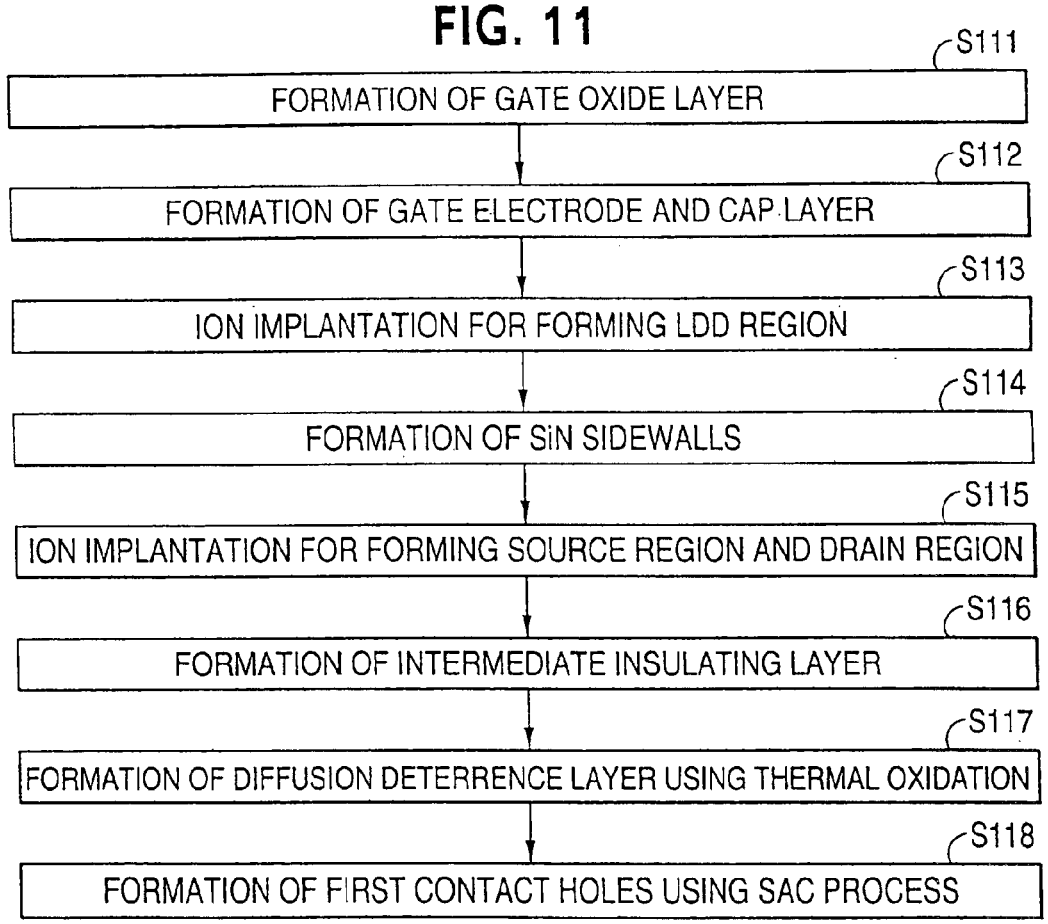
FIG. 11 is a flow chart of a method for manufacturing the semiconductor device of the fourth embodiment.
Figure 12A:
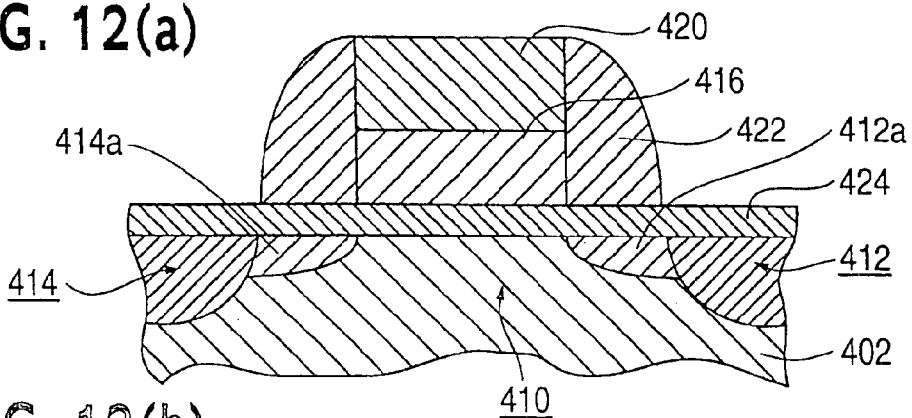
FIG. 12 is a cross sectional view showing the method for manufacturing the semiconductor device of the fourth embodiment.
Figure 12B:
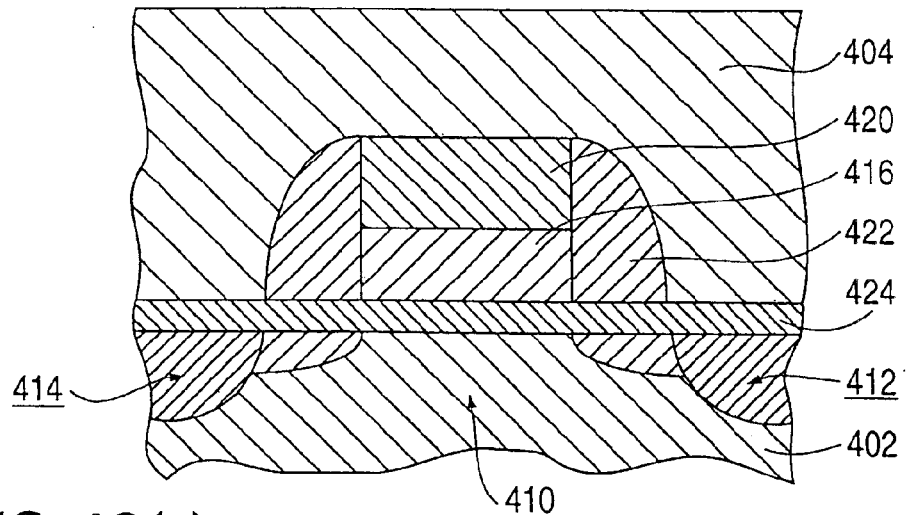
Figure 12C:
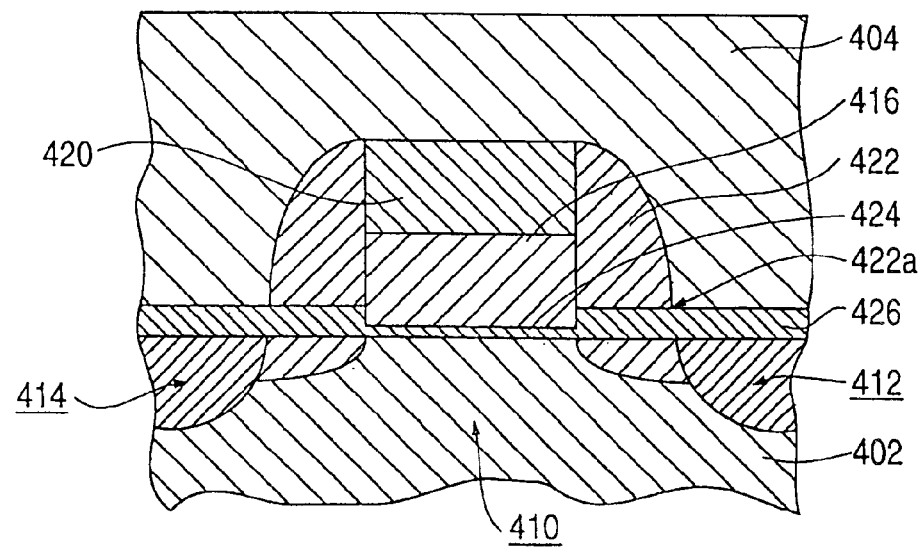

FIG. 11 is a flow chart of the method for manufacturing a semiconductor device of this embodiment, and FIG. 12 is a cross sectional view showing the method for manufacturing the same. The method for manufacturing the semiconductor device of this embodiment is described below.

The gate oxide layer 424 is formed on the surface of the semiconductor substrate 402 by using thermal oxidation. This gate oxide layer 424 has a thickness of about 10 nm. (Step S111)

The gate electrode material 416 and the cap layer material 420 are formed on the gate oxide layer 424. A lithography method and an anisotropic etching technique, such as a RIE method, are employed to etch the gate electrode material 416 and the cap layer material 420. The gate electrode 416 and the cap layer are thereby formed. (Step S112)

Ion implantation for forming the LDD region 412a and 414a is performed by using the cap layer 420 as the mask. This implantation makes lightly doped regions 412a and 414a. (Step S113)

A SiN sidewall layer, having a thickness from 100 nm to 200 nm, is formed on the semiconductor substrate using LP-CVD. An anisotropic etching technique, such as a RIE method, is employed to etch the SiN sidewall layer so that SiN sidewalls 422 are formed. (Step S114)

Ion implantation for forming the source region 412 and drain region 414 is performed using the cap layer 420 and sidewalls 422 as a mask. An annealing is performed after the ion implantation. This annealing diffuses implanted ion and forms source region 412 and drain region 414. (FIG. 12(a), Step S115)

The intermediate insulating layer 404 is formed on the semiconductor substrate 402. The intermediate insulating layer 404 is made of BPSG in this embodiment. (FIG. 12(b), Step S116)

A silicon oxide layer 426 is formed on the gate oxide layer 424 using thermal oxidation. The thermal oxidation of this embodiment is performed at a temperature of over 850° C. and in an oxygen atmosphere. Thickening begins from the edge portion 422a of the side walls, and expands into the portion near the gate electrode 416. The time of this oxidation is controlled to expand the thickness of the gate oxide layer other than at the portion lying under the gate electrode 416. This silicon oxide layer 426 works as the diffusion deterrent layer. The oxide layer 426 has a thickness of about 20 nm. Subsequent steps are the same as those in the third embodiment. (FIG. 12(c), Step S118)

In this embodiment, the thermal oxidation is performed after the formation of the sidewalls and source/drain regions. Hydrogen and nitrogen in the sidewalls are diffused into the surface of silicon substrate during annealing. However, the thermal oxidation oxidizes the surface of silicon substrate. Therefore, interface traps, which are related to hot carrier, are reduced, and reliability is improved. An oxide layer on the side surface of the gate electrode is not formed in this embodiment. Therefore, the variation in resistance of the gate electrode is prevented.

The surface of the intermediate insulating layer 404 is flattened during thermal oxidation because the intermediate insulating layer is made of BPSG. Therefore, manufacturing is simplified in this embodiment.

Figure 13:
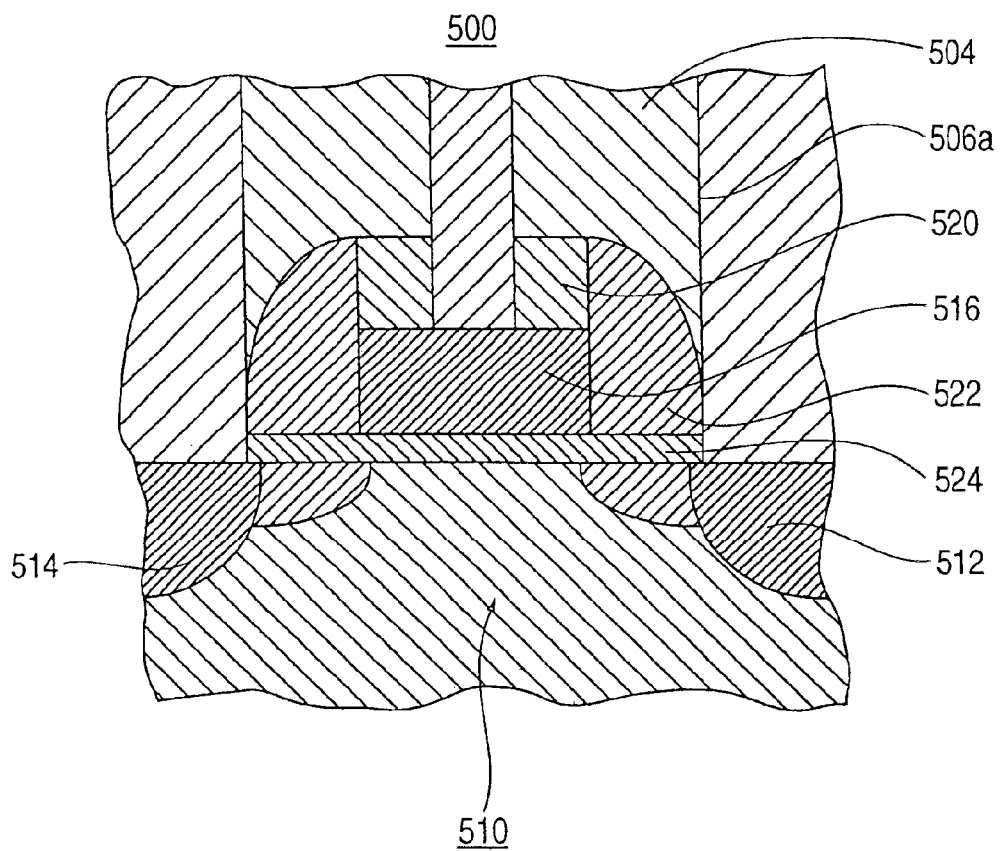
FIG. 13 is a cross sectional view showing a semiconductor device according to a fifth preferred embodiment.

FIG. 13 is a schematic diagram of this embodiment. As shown in FIG. 13, the semiconductor device of this embodiment has a structure which is similar to that of the prior art. In this embodiment, however, the method for manufacturing the semiconductor device is different from the prior art.

FIG. 14 is a flow chart of the method for manufacturing the semiconductor device of this embodiment, and FIG. 15 is a cross sectional view showing the method for manufacturing the same. The method for manufacturing the semiconductor device of this invention is described below.

The gate oxide layer 524 is formed on the surface of the semiconductor substrate 502 by using thermal oxidation. This gate oxide layer 524 has a thickness of about 10 nm. (Step S141)

Figure 15A:
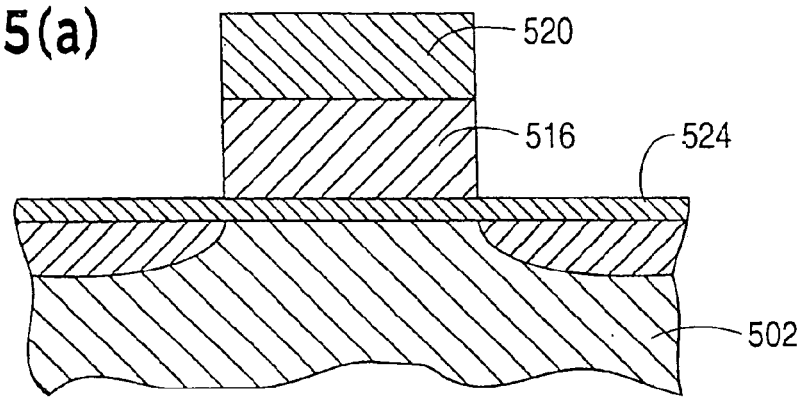
FIG. 15 is a cross sectional view showing the method for manufacturing the semiconductor device of the fifth embodiment.
Figure 15B:
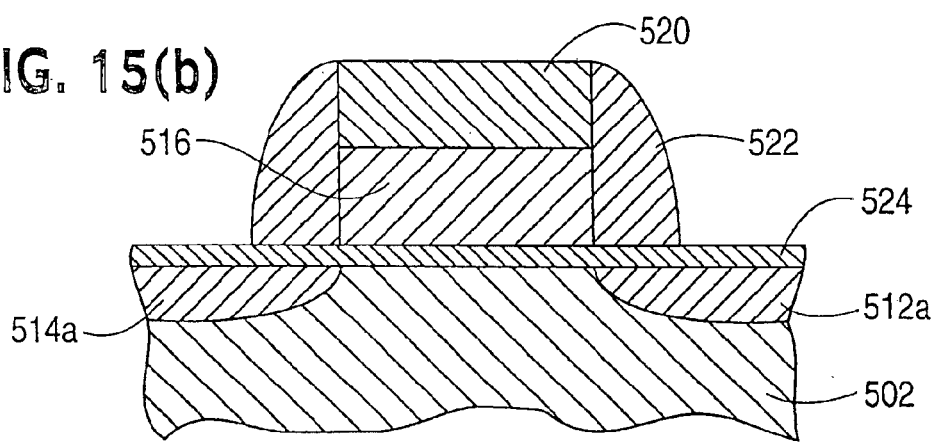
Figure 15C:
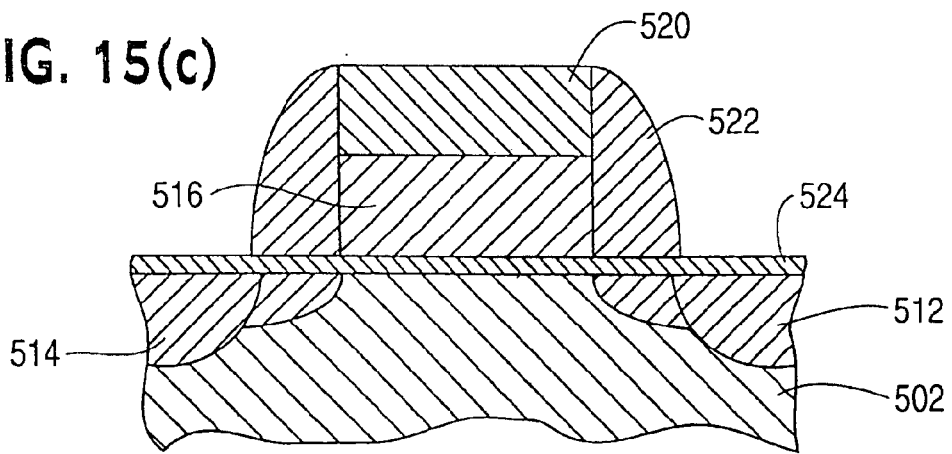

The gate electrode material 516 and the cap layer material 520 are formed on the gate oxide layer 524. A lithography method and an anisotropic etching technique, such as a RIE method, are employed to etch the gate electrode material 516 and the cap layer material 520. The gate electrode 516 and the cap layer are thereby formed as seen in FIG. 15(a). (Step S142)

Ion implantation for forming the LDD region 512a and 514a is performed using the cap layer 520 as a mask. This implantation makes lightly doped regions 512a and 514a. (Step S143)

A SiN sidewall layer, having a thickness from 100 nm to 200 nm, is formed on the semiconductor substrate using LP-CVD. The formation of the SiN sidewall layer is performed at a temperature of over 850° C. In experiments, the inventors have shown that high temperature formation of the SiN sidewall reduces the hydrogen that diffuses into the semiconductor substrate. An anisotropic etching technique, such as a RIE method, is employed to etch the SIN sidewall layer, so that SiN sidewalls 522 are formed. (FIG. 15(b), Step S144)

Ion implantation for forming the source region 512 and drain region 514 is performed using the cap layer 520 and sidewalls 522 as a mask. An annealing is performed after the ion implantation. This annealing diffuses implanted ions and forms source region 512 and drain region 514. (FIG. 15(c), Step S145)

The intermediate insulating layer 504 is formed on the semiconductor substrate 502. The intermediate insulating layer 504 is made of a material which is different from the material of the cap layer 520 and the side walls 522. The intermediate insulating layer 104 is made of silicon oxide in this embodiment. (Step S146)

The first contact holes 506a are formed using a SAC process. The intermediate insulating layer 504 is etched using an etchant which has a smaller etching rate for SiN than for silicon-oxide. Therefore, the SiN sidewalls are used as a stopper. The intermediate layer 504 and the silicon oxide 524 over the source region and drain region are etched in this step. (Step S147) Subsequent steps are the same as those of other embodiments.

In this embodiment, high temperature formation of SiN sidewalls reduces the hydrogen and nitrogen that diffuses into the silicon substrate 502. For example, amount of hydrogen which diffuses into the semiconductor substrate when the sidewalls are made at 850° C. is about one-third of that made at 780° C.

Therefore, interface traps, which are related to hot carrier, are reduced near the surface of the semiconductor substrate, and the reliability of the MOSFET is improved.

Figure 16:
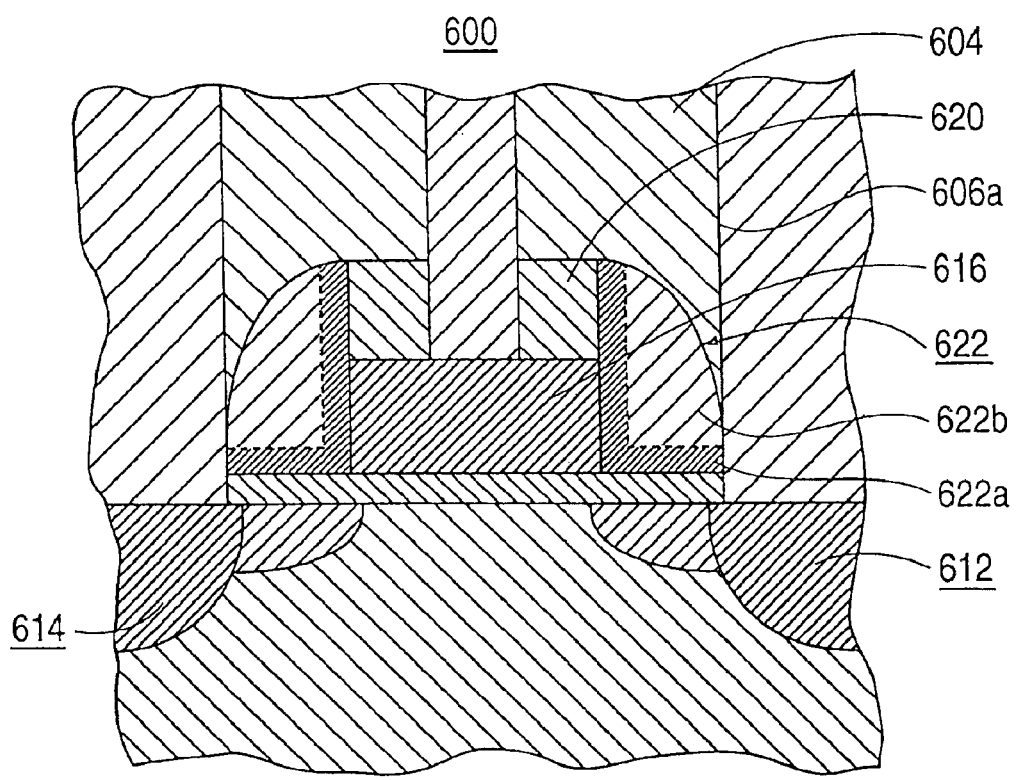
FIG. 16 is a cross sectional view showing a semiconductor device according to a sixth preferred embodiment.

FIG. 16 is a schematic diagram of this embodiment. As shown in FIG. 16, The SiN sidewalls of this embodiment have two layers.

Figure 17:
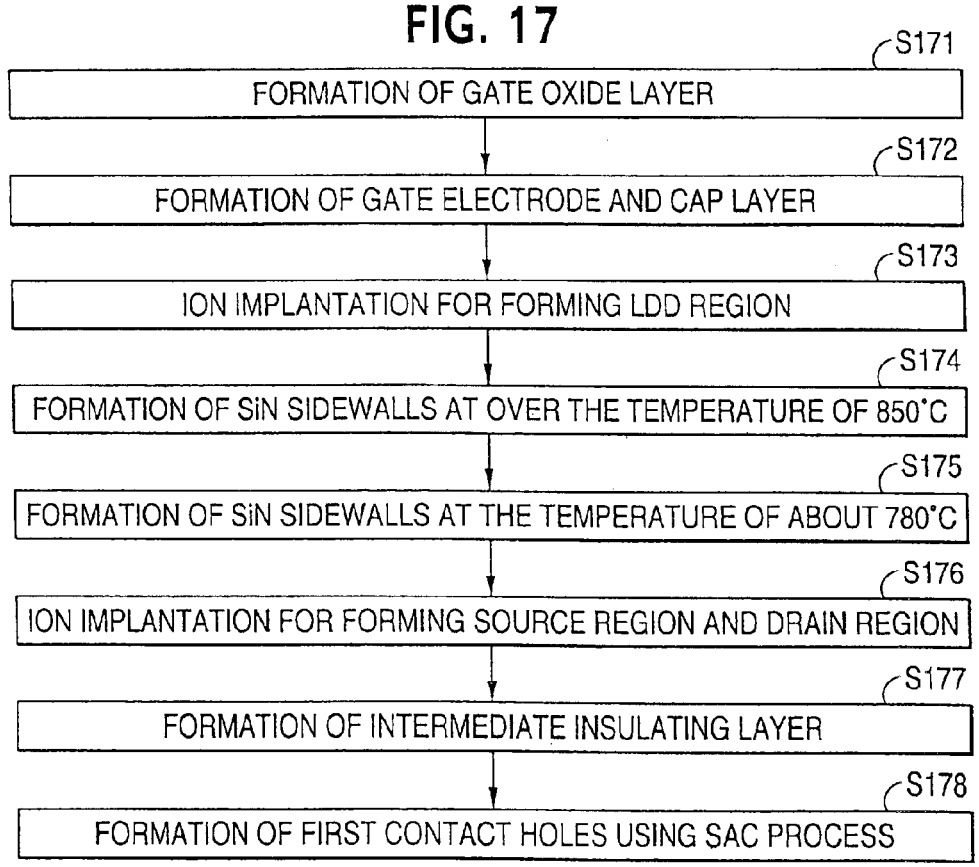
FIG. 17 is a flow chart of a method for manufacturing the semiconductor device of the sixth embodiment.

FIG. 17 is a flow chart of a method for manufacturing the semiconductor device of this embodiment, and FIG. 18 is a cross sectional view showing the method for manufacturing the same. The method for manufacturing the semiconductor device of this embodiment is described below.

The gate oxide layer 624 is formed on the surface of the semiconductor substrate 602 by using thermal oxidation. This gate oxide layer 624 has a thickness of about 10 nm. (Step S171)

The gate electrode material 616 and the cap layer material 620 are formed on the gate oxide layer 624. A lithography method and an anisotropic etching technique, such as a RIE method, are employed to etch the gate electrode material 616 and the cap layer material 620. The gate electrode 616 and the cap layer are thereby formed. (Step S172)

Ion implantation for forming the LDD region 612a and 614a is performed by using the cap layer 620 as the mask. This implantation makes lightly doped regions 612a and 614a. (Step S173)

Figure 18A:
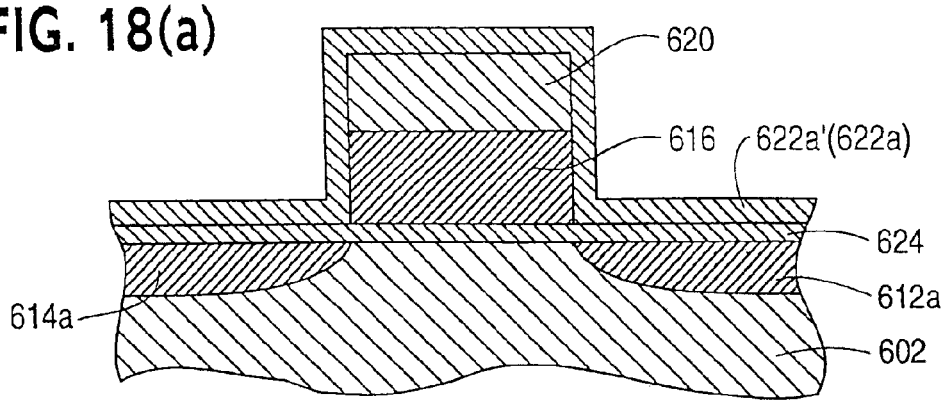
FIG. 18 is a cross sectional view showing the method for manufacturing the semiconductor device of the sixth embodiment.
Figure 18B:
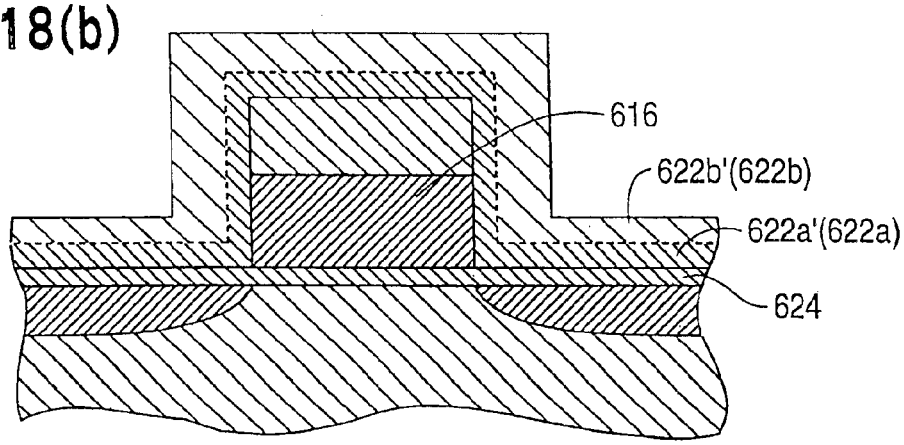
Figure 18C:
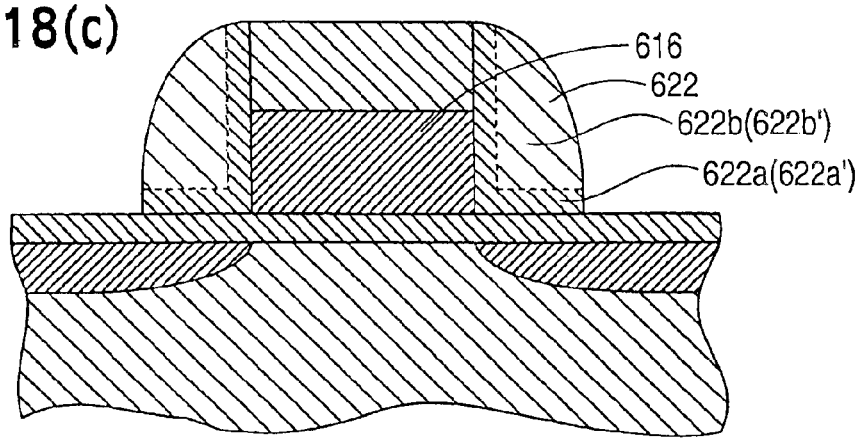

A first SiN sidewall layer 622a, having a thickness from 20 nm to 40 nm, is formed on the semiconductor substrate using LP-CVD. The formation of the first SiN sidewall layer is performed at a temperature exceeding 850° C. as shown in FIG. 18(a). (Step S174) The high temperature formation of the SiN sidewall reduces the hydrogen that diffuses into the semiconductor substrate. Then, a second SiN sidewall layer 622b, having a thickness from 80 nm to 160 nm, is formed on the first sidewall layer using LP-CVD.(FIG. 18(b) The formation of the second SiN sidewall is performed at a temperature of about 780° C. An anisotropic etching technique, such as a RIE method, is employed to etch first and second SiN sidewall layers, so that SiN sidewalls 622 are formed as shown in FIG. 18(c). (Step S175)

Ion implantation for forming the source region 612 and drain region 614 is performed by using the cap layer 620 and sidewalls 622 as a mask. An annealing is performed after the ion implantation. This annealing diffuses implanted ions and forms source region 612 and drain region 614. (Step S176)

The intermediate insulating layer 604 is formed over the semiconductor substrate 602. The intermediate insulating layer 604 is made of a material which is different from the material of the cap layer 620 and the side walls 622. The intermediate insulating layer 604 is made of silicon oxide in this embodiment. (Step S177)

The first contact holes 606a are formed using a SAC process. The intermediate insulating layer 604 is etched using an etchant which has a smaller etching rate for SiN than for silicon-oxide. Therefore, the SiN sidewalls are used as a stopper. The intermediate layer 604 and the silicon oxide 624 over the source region and drain region are etched in this step. Subsequent steps are the same as those of the other embodiments. (Step S178)

In this embodiment, high temperature formation of the first SiN sidewalls reduces the hydrogen and nitrogen that diffuses into the silicon substrate 602 and the first SiN layers, which are formed at high temperature, prevent hydrogen and nitrogen in the second sidewalls from diffusing into the silicon substrate 102. Therefore, interface traps, which are related to hot carrier, are reduced near the surface of the semiconductor substrate, and the reliability of the MOSFET is improved.

Figure 19:
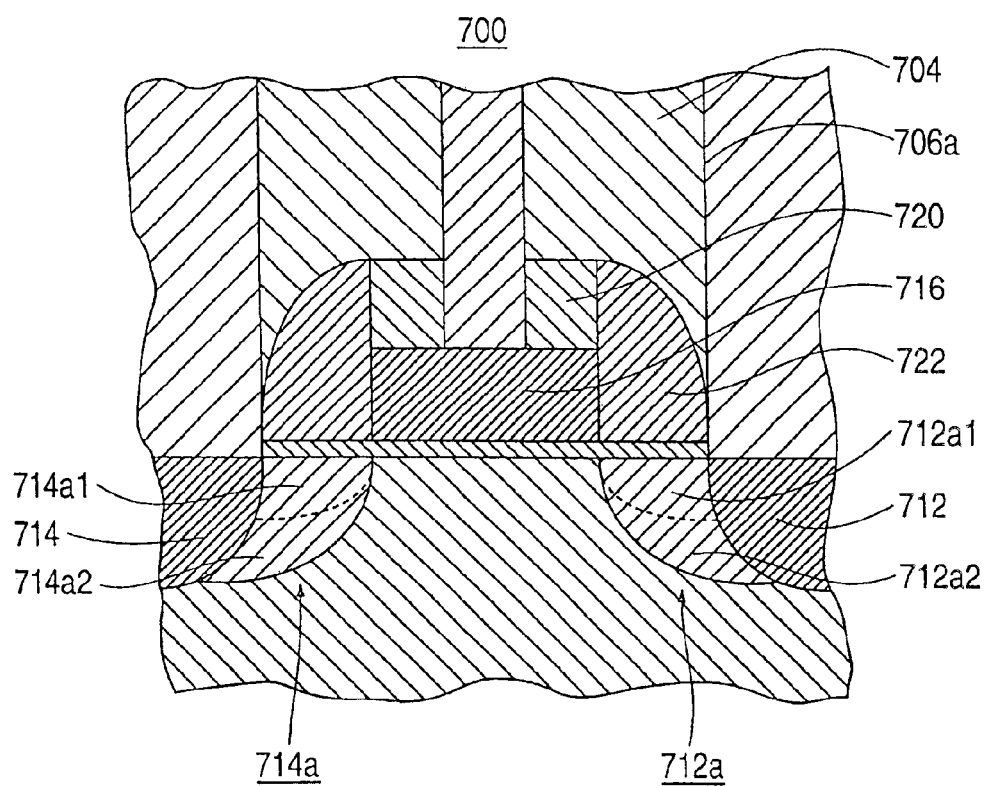
FIG. 19 is a cross sectional view showing a semiconductor device according to a seventh preferred embodiment.

FIG. 19 is a schematic diagram of this embodiment. As shown in FIG. 19, The impurity concentration of the LDD of this embodiment regions is different from that of the prior art. The LDD portion 712a of this embodiment has a shallow portion 712a1 near the surface of the semiconductor substrate, and the deep portion 712a2 formed under the shallow portion 712a1. The LDD portion 714a of this embodiment has a shallow portion 714a1 near the surface of the semiconductor substrate, and the deep portion 714a2 formed under the shallow portion 714a1.

FIG. 22 shows the impurity concentration of the LDD regions of this embodiment. In FIG. 22, the dotted line shows an impurity concentration of the prior art. As shown in FIG. 22, the peak of the impurity concentration of this embodiment is deeper than that of the prior art. This peak is made in the deep portion 712a2 and 714a2. The depth of these deep portions are about 0.1 μm from the surface of the silicon substrate.

The hot carrier generation region is deeper than that of the prior art, because the peak of the impurity concentration is formed in a deeper portion of the substrate.

Figure 20:
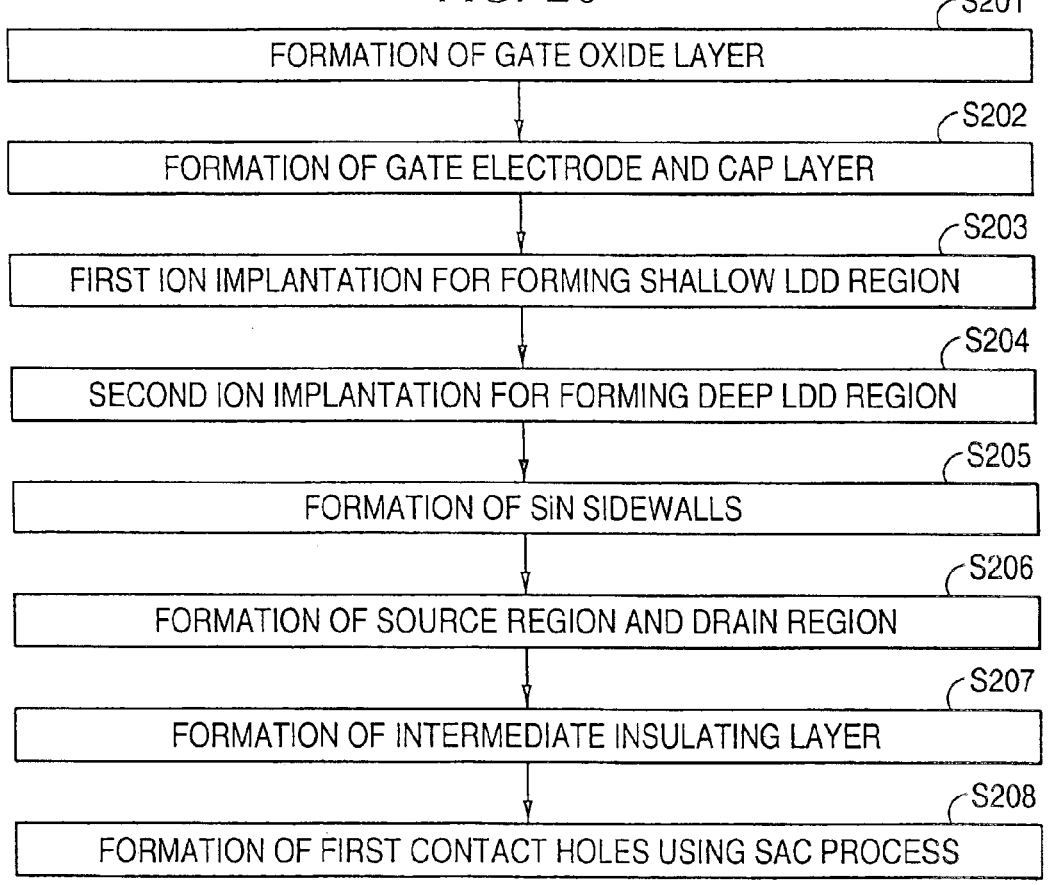
FIG. 20 is a flow chart of a method for manufacturing the semiconductor device of the seventh embodiment.
Figure 21A:
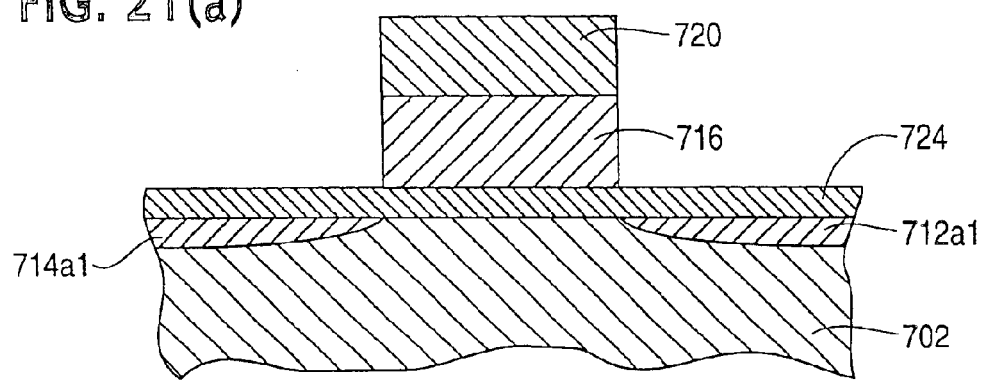
FIG. 21 is a cross sectional view showing the method for manufacturing the semiconductor device of the seventh embodiment.
Figure 21B:
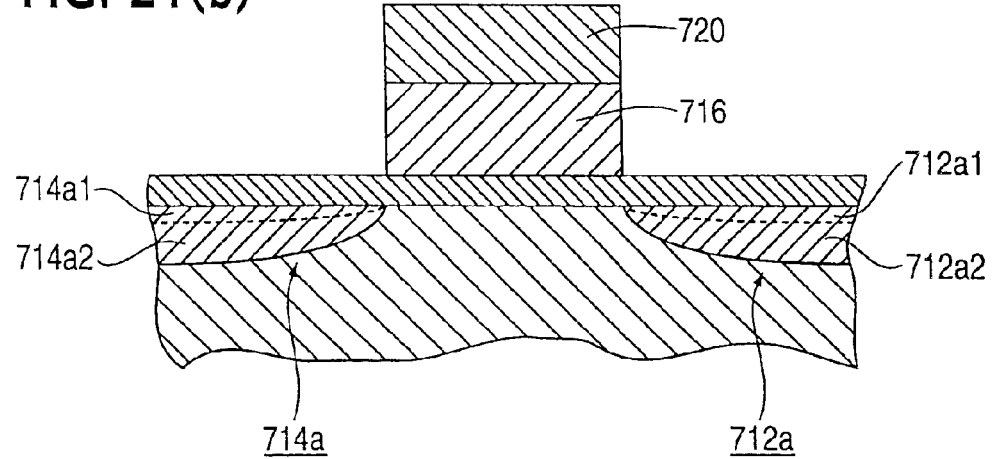
Figure 23:
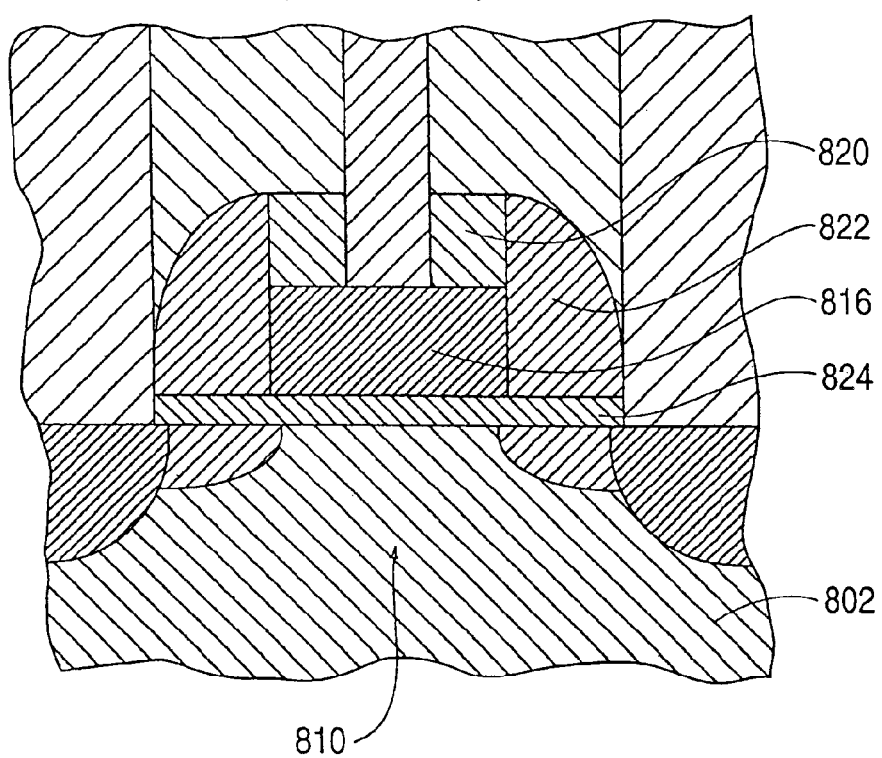
FIG. 23 shows a schematic diagram of the MOSFET 800 manufactured by using a Self Aligned Contact process.

FIG. 20 is a flow chart of the method for manufacturing the semiconductor device of this embodiment, and FIG. 21 is a cross sectional view showing the method for manufacturing the same. The method for manufacturing the semiconductor device of this invention is described below.

The gate oxide layer 724 is formed on the surface of the semiconductor substrate 702 by using thermal oxidation. This gate oxide layer 724 has a thickness of about 10 nm.(Step S201)

The gate electrode material 716 and the cap layer material 720 are formed on the gate oxide layer 724. A lithography method and an anisotropic etching technique, such as a RIE method, are employed to etch the gate electrode material 716 and the cap layer material 720. The gate electrode 716 and the cap layer are thereby formed. (Step S202)

A first ion implantation for forming the shallow portion 712a1 and 714a1 of LDD regions is performed using the cap layer 720 as a mask. This implantation is performed at an acceleration voltage of 20 keV. (FIG. 21(a), Step S203)

Then, a second ion implantation for forming the deep portion 712a2 and 714a2 of LDD regions is performed using the cap layer 720 as a mask. This implantation is performed at an acceleration voltage of 70 keV. (Step S204)

A SiN sidewall layer, having a thickness of from 100 nm to 200 nm, is formed on the semiconductor substrate using LP-CVD.

An anisotropic etching technique, such as a RIE method, is employed to etch the SiN sidewall layer, so that SiN sidewalls 722 are formed. (Step S205)

Ion implantation for forming the source region 712 and drain region 714 is performed by using the cap layer 720 and sidewalls 722 as a mask. An annealing is performed after the ion implantation. This annealing diffuses implanted ions and forms source region 712 and drain region 714. (Step S206)

The intermediate insulating layer 704 is formed on semiconductor substrate 702. The intermediate insulating layer 704 is made of a material which is different from the material of the cap layer 720 and the side walls 722. The intermediate insulating layer 704 is made of silicon oxide in this embodiment. (Step S207)

The first contact holes 706a are formed using a SAC process. The intermediate insulating layer 704 is etched using an etchant which has smaller etching rate for SiN than than for silicon-oxide. Therefore, the SiN sidewalls are used as a stopper. The intermediate layer 704 and the silicon oxide 724 located over the source region and drain region are etched in this step. Subsequent steps are the same as those of other embodiments.

The hot carrier region is made deeper in this embodiment. Therefore, the trapping of hot carriers near the surface of the semiconductor substrate is decreased, and the reliability of the MOSFET is improved.

What is claimed is:

1. A method of manufacturing a semiconductor device comprising:
    preparing a semiconductor substrate;
    forming a gate first insulating layer on the semiconductor substrate;
    forming a lower gate electrode layer and a cap gate layer on the gate insulating layer;
    patterning the lower gate electrode layer and the cap gate layer to form a gate electrode structure;
    forming an LDD region on the semiconductor substrate;
    depositing an oxide layer on the gate electrode structure and the semiconductor substrate, wherein a thickness of the oxide layer is greater than a thickness of the gate insulating layer;
    forming a nitride layer on the oxide layer; and
    etching the oxide layer and the nitride layer to form a nitride sidewall spacer on the gate electrode structure through the oxide layer.

2. A method of manufacturing a semiconductor device according to claim 1, wherein said depositing comprises a CVD.

3. A method of manufacturing a semiconductor device according to claim 1, wherein said forming a gate insulating layer comprises an oxidation.

4. A method of manufacturing a semiconductor device according to claim 1, wherein the lower gate electrode layer is formed of polysilicon.

5. A method of manufacturing a semiconductor device according to claim 1, wherein said etching comprises an anisotropic etching.

6. A method of manufacturing a semiconductor device according to claim 1, wherein said forming a nitride layer comprises an LP-CVD.

7. A method of manufacturing a semiconductor device according to claim 1, further comprising:
    forming a source/drain region on the semiconductor substrate using the gate electrode structure and the nitride sidewall spacer as a mask.

8. A method of manufacturing a semiconductor device according to claim 7, further comprising:
    forming an intermediate insulating layer on the gate electrode structure and the semiconductor substrate;
    forming a contact hole through the intermediate insulating layer so as to expose the source/drain region; and
    filling a conductive material into the contact hole to form a source/drain contact electrode.

9. A method of manufacturing a semiconductor device comprising:
    preparing a semiconductor substrate;
    oxidizing the semiconductor substrate to form a gate insulating layer on the semiconductor substrate;
    forming a polysilicon layer and a metal layer on the gate insulating layer;
    patterning the polysilicon layer and the metal layer to form a gate electrode structure;
    forming an LDD region on the semiconductor substrate using the gate electrode structure as a mask;
    depositing an oxide layer on the gate electrode structure and the semiconductor substrate, wherein a thickness of the oxide layer is greater than a thickness of the gate insulating layer;
    forming a nitride layer on the oxide layer; and
    etching the oxide layer and the nitride layer to form a nitride sidewall spacer on the gate electrode structure through the oxide layer.

10. A method of manufacturing a semiconductor device according to claim 9, wherein said depositing comprises a CVD.

11. A method of manufacturing a semiconductor device according to claim 9, wherein said etching comprises an anisotropic etching.

12. A method of manufacturing a semiconductor device according to claim 9, wherein said forming a nitride layer comprises an LP-CVD.

13. A method of manufacturing a semiconductor device according to claim 9, further comprising:
    forming a source/drain region on the semiconductor substrate using the gate electrode structure and the nitride sidewall spacer as a mask.

14. A method of manufacturing a semiconductor device according to claim 13, further comprising:
    forming an intermediate insulating layer on the gate electrode structure and the semiconductor substrate;
    forming a contact hole through the intermediate insulating layer so as to expose the source/drain region; and
    filling a conductive material into the contact hole to form a source/drain region contact electrode.

15. A method of manufacturing a MOSFET comprising:
    preparing a semiconductor substrate;
    forming a gate insulating layer on the semiconductor substrate;
    forming a lower gate electrode layer and a cap gate layer on the gate insulating layer;
    removing a part of the lower gate electrode layer and the cap gate layer to form a gate electrode structure;
    implanting ions into the semiconductor substrate using the gate electrode structure as a mask to form an LDD region on the semiconductor substrate;
    depositing an oxide layer on the gate electrode structure and the semiconductor substrate by a CVD, wherein a thickness of the oxide layer is greater than a thickness of the gate insulating layer;
    forming a nitride layer on the oxide layer; and
    subjecting the oxide layer and the nitride layer to anisotropic etching to form a nitride sidewall spacer on the gate electrode structure through the oxide layer.

16. A method of manufacturing a MOSFET according to claim 15, wherein said forming a gate insulating layer comprises oxidation.

17. A method of manufacturing a MOSFET according to claim 15, wherein the lower gate electrode layer is formed of polysilicon.

18. A method of manufacturing a semiconductor device according to claim 15, wherein said forming a nitride layer comprises an LP-CVD.

19. A method of manufacturing a MOSFET according to claim 15, further comprising:
    implanting ions into the semiconductor substrate using the gate electrode structure and the nitride sidewall spacer as a mask to form a source/drain region on the semiconductor substrate.

20. A method of manufacturing a semiconductor device according to claim 19, further comprising:

forming an intermediate insulating layer on the gate electrode structure and the semiconductor substrate;

forming a contact hole through the intermediate insulating layer so as to expose the source/drain region; and filling a conductive material into the contact hole to form a source/drain contact electrode.

* * * * *